United States Patent
Chiba et al.

(12)

(10) Patent No.: US 6,366,141 B1
(45) Date of Patent: Apr. 2, 2002

(54) SEMICONDUCTOR DRIVER CIRCUIT UTILIZING SUBSTRATE VOLTAGE CONTROL

(75) Inventors: Tadashi Chiba; Koichi Morikawa, both of Tokyo (JP)

(73) Assignee: Oki Electric Industry CO, Ltd., Tokyo (JP)

( * ) Notice: Subject to any disclaimer, the term of this patent is extended or adjusted under 35 U.S.C. 154(b) by 0 days.

(21) Appl. No.: 09/688,935

(22) Filed: Oct. 17, 2000

(30) Foreign Application Priority Data

Jan. 11, 2000 (JP) ........................ 2000-006093

(51) Int. Cl.[7] .............................................. H03K 3/00
(52) U.S. Cl. ...................... 327/108; 327/109; 327/534; 326/36; 326/87
(58) Field of Search ................... 327/534, 535, 327/536, 108, 109, 112; 326/35, 36, 88, 86, 87

(56) References Cited

U.S. PATENT DOCUMENTS

| 5,045,716 | A | * | 9/1991 | Takacs et al. | 327/534 |
| 5,157,279 | A | * | 10/1992 | Lee | 327/534 |
| 5,212,415 | A | * | 5/1993 | Murakami et al. | 327/390 |
| 5,534,795 | A | * | 7/1996 | Wert et al. | 326/81 |
| 5,717,343 | A | * | 2/1998 | Kwong | 326/83 |
| 5,867,039 | A | * | 2/1999 | Golke | 326/81 |
| 5,963,055 | A | * | 10/1999 | Tanaka et al. | 326/83 |
| 6,191,615 | B1 | * | 2/2001 | Koga | 326/81 |

OTHER PUBLICATIONS

Body Bias Variable SOI–CMOS Driver Circuit; Yoshiki Wada et al.; *Mitsubishi Electric crop., S.–L. Technical Report of IEICE*; ICD97–45, pp. 23–29, 1997.

* cited by examiner

*Primary Examiner*—Timothy P. Callahan
*Assistant Examiner*—An T. Luu
(74) *Attorney, Agent, or Firm*—Rabin & Berdo, P.C.

(57) ABSTRACT

A semiconductor driver circuit includes a first inverter circuit that inverts an input voltage and supplies a first inverted voltage, and a second inverter circuit that inverts the first inverted voltage and outputs a second inverted voltage. The second inverter circuit includes a first conduction type transistor, such as a PMOS transistor, and a second conduction type transistor, different from the first conduction type transistor, such as an NMOS transistor. The driver circuit further includes a substrate voltage supply circuit that supplies voltages to the substrate of the first conduction type transistor and the substrate of the second conduction type transistor, respectively, according to the second inverted voltage, and a substrate voltage control circuit that adjusts the substrate voltages applied to either or both of the first and second conduction type transistors, according to the second inverted voltage, in order to lessen the power consumption of the driver circuit.

10 Claims, 9 Drawing Sheets

US 6,366,141 B1

SEMICONDUCTOR DRIVER CIRCUIT UTILIZING SUBSTRATE VOLTAGE CONTROL

BACKGROUND OF THE INVENTION

1. Field of the Invention

The present invention relates to a driver circuit, and particularly to a body bias variable driver circuit for implementing operation at a low source voltage.

This application is a counterpart of Japanese Patent Application, Serial Number 006093/2000, filed Jan. 11, 2000, the subject matter of which is incorporated herein by reference.

2. Description of the Related Art

A circuit disclosed in the following reference has heretofore been proposed as an SOI (Silicon On Insulator). driver circuit for controlling a substrate voltage.

"Body Bias Variable SOI-CMOS Driver Circuit", by Yoshiki Wada et al; Mitsubishi Electric Corp., S. (Signal)-L.(Learning) Technical Report of IEICE, ICD97-45, p. 23–29, 1997

A description will now be made of the body bias variable SOI-CMOS driver circuit (hereinafter abbreviated as "driver circuit" disclosed in the above-described reference. FIG. 8 is a circuit diagram of the driver circuit disclosed in the above-described reference. The driver circuit comprises an inverter circuit A, a substrate voltage supply circuit B and an inverter circuit C. The substrate voltage supply circuit B is electrically connected to the inverter circuit A and the inverter circuit C.

The inverter circuit A comprises a PMOS transistor 802 and an NMOS transistor 803.

The PMOS transistor and NMOS transistor will now be described. The PMOS transistor is an abbreviation for 'P channel MOS transistor' and is comprised of a control electrode, a first electrode, and a second electrode. The first electrode of the PMOS transistor serves as a source or drain electrode, and the second electrode thereof serves as a drain or source electrode. When a reference voltage GND (also called "ground voltage GND"; hereinafter abbreviated as "voltage GND" is applied to the control electrode of the PMOS transistor, the PMOS transistor is brought to a conducting state. On the other hand, when a source voltage $V_{DD}$ (also called "drive voltage $V_{DD}$"; hereinafter abbreviated as "voltage $V_{DD}$" is applied to the control electrode of the PMOS transistor, the PMOS transistor is brought to a non-conducting state. Next, the NMOS transistor is an abbreviation for 'N channel MOS transistor' and comprises a control electrode, a first electrode and a second electrode. The first electrode of the NMOS transistor serves as a source or drain electrode, and the second electrode thereof serves as a drain or source electrode. When the voltage $V_{DD}$ is applied to the control electrode of the NMOS transistor, the NMOS transistor is brought to the conducting state. On the other hand, when the voltage GND is applied to the control electrode of the NMOS transistor, the NMOS transistor is brought to the non-conducting state. Incidentally, a period during which each of the PMOS transistor and the NMOS transistor changes from the non-conducting state to the conducting state, is called an "active period" and a period other than that is called a "static period" in the subsequent description.

In the inverter circuit A, the control electrode of the PMOS transistor 802 is electrically connected to a node 801, the first electrode thereof is supplied with the voltage $V_{DD}$, and the second electrode thereof is electrically connected to a node 804. Further, the control electrode of the NMOS transistor 803 is electrically connected to the node 801, the first electrode thereof is supplied with the voltage GND, and the second electrode thereof is electrically connected to the node 804.

The substrate voltage supply circuit B comprises two PMOS transistors 805 and 806 and two NMOS transistors 807 and 808.

The voltage GND is applied to a control electrode of the PMOS transistor 805, the voltage $V_{DD}$ is applied to a first electrode thereof. Further, a second electrode of the PMOS transistor 805 is electrically connected to a node BP. In the substrate voltage supply circuit B, the voltage GND is always applied to the control electrode of the PMOS transistor 805 so that the PMOS transistor 805 is always kept in conduction. Thus, the PMOS transistor 805 is used as resistance means interposed between the node BP and the voltage $V_{DD}$. A control electrode of the PMOS transistor 806 is electrically connected to a node 809, a first electrode thereof is electrically connected to the node BP, and a second electrode thereof is electrically connected to the node 804. A substrate for the PMOS transistor 806 and the node BP are now connected to each other, whereby the voltage applied to the. substrate of the PMOS transistor 806 depends on a voltage applied to the node BP.

The voltage $V_{DD}$ is applied to a control electrode of the NMOS transistor 807, a first electrode thereof is supplied with the voltage GND, and a second electrode thereof is electrically connected to a node BN.

In the substrate voltage supply circuit B, the voltage $V_{DD}$ is applied to the control electrode of the NMOS transistor 807 at all times so that the NMOS transistor 807 is always kept in conduction. Thus, the NMOS transistor 807 is utilized as resistance means interposed between the node BN and the voltage GND. A control electrode of the NMOS transistor 808 is electrically connected to the node 809, a first electrode thereof is electrically connected to the node BN, and a second electrode thereof is electrically connected to the node 804. A substrate for the NMOS transistor 808 is electrically connected to the node BN here, so that a voltage applied to the substrate of the NMOS transistor 808 depends on the voltage applied to the node BN.

The inverter circuit C comprises a PMOS transistor 810 and an NMOS transistor 811. A control electrode of the PMOS transistor 810 is electrically connected to the node 804, a first electrode thereof is supplied with the voltage $V_{DD}$, and a second electrode thereof is electrically connected to the node 809. Further, a control electrode of the NMOS transistor 811 is electrically connected to the node 804, a first electrode thereof is supplied with the voltage GND, and a second electrode thereof is electrically connected to the node 809. A substrate for the PMOS transistor 810 is electrically connected to the node BP, whereas a substrate for the NMOS transistor 811 is electrically connected to the node BN.

The operation of the driver circuit described in the above-described reference will next be explained with reference to FIGS. 8 and 9. FIG. 9 shows the result of simulation of the driver circuit. FIG. 9(a) is a timing chart showing waveforms at the nodes 804 and 809. FIG. 9(b) is a timing chart showing waveforms at the nodes BP and BN.

Now consider where the voltage GND is first applied to the node 801 at a time T1. In doing so, the NMOS transistor 803 is brought into non-conduction and the PMOS transistor 802 is brought into conduction. Thus, the node 804 is brought to the voltage $V_{DD}$ since the PMOS transistor 802 is kept in conduction.

Since the voltage $V_{DD}$ is applied to the node 804, the PMOS transistor 810 is brought into non-conduction and the NMOS transistor 811 is brought into conduction. Thus, since the NMOS transistor 811 is kept in conduction, the node 809 assumes the voltage GND.

Since the voltage GND is applied to the node 809, the NMOS transistor 808 is brought to the non-conducting state and the PMOS transistor 806 is brought to the conducting state. Since the NMOS transistor 808 is kept in non-conduction, the node BN is maintained at the voltage GND. Since the NMOS transistor 807 is kept in conduction, the voltage GND is applied to the substrates for the NMOS transistor 808 and the NMOS transistor 811. On the other hand, since the PMOS transistor 806 is kept in conduction and the PMOS transistor 805 is kept in conduction, the voltage $V_{DD}$ is applied to the node 804. Incidentally, since the PMOS transistor 805 is kept in conduction, the voltage $V_{DD}$ is applied to the substrates for the PMOS transistors 806 and 810

Assume that the voltage $V_{DD}$ is next applied to the node 801 between times T1 and T2. In doing so, the voltage applied to the node 801 changes from the "voltage GND at the time T1" to the "voltage $V_{DD}$", so that the NMOS transistor 803 is brought to the conducting state and the PMOS transistor 802 is brought to the non-conducting state. Thus, since the NMOS transistor 803 is kept in conduction, the voltage at the node 804 is changed to the voltage GND.

Owing to the change of the voltage at the node 804 to the voltage GND, the PMOS transistor 810 is brought into conduction and the NMOS transistor 811 is brought into non-conduction. Since the PMOS transistor 810 is kept in conduction, the voltage at the node 809 is changed to the voltage $V_{DD}$.

A slight time is required to perform processing in the inverter circuit C by the time the voltage at the node 809 changes from the "voltage GND" to the "voltage $V_{DD}$" after the voltage at the node 804 has been changed from the "voltage $V_{DD}$" to the "voltage GND". Thus, the PMOS transistor 806 is maintained in the conducting state. As a result, a time zone exists in which the PMOS transistor 805, PMOS transistor 806 and NMOS transistor 803 are kept in conduction. Thus, a flow of current occurs over a channel or path extending in order of the "voltage $V_{DD}$-→PMOS transistor 805-→PMOS transistor 806-→NMOS transistor 803-→voltage GND" (this will hereinafter be called "current path is produced". Owing to such path generation, the voltage at the node BP to which the voltage $V_{DD}$ is applied, gradually drops. A drop in voltage of the node BP is terminated when the voltage at the node 809 is changed to the voltage $V_{DD}$ and the PMOS transistor 806 is brought to the non-conducting state. Thereafter, the voltage $V_{DD}$ is applied to the node BP through the PMOS transistor 805 kept in conduction at all times, whereby the voltage applied to the node BP gradually rises to the voltage $V_{DD}$.

Assume that the voltage GND is next applied to the node 801 between times T3 and T4. The state of each circuit of the driver circuit disclosed in the reference at the time T3 is identical to that at the time T2 described in the above. In doing so, the voltage applied to the node 801 changes from the "voltage $V_{DD}$ at the time T3 to the "voltage GND", so that the PMOS transistor 802 is brought into conduction and the NMOS transistor 803 is brought into non-conduction. Thus, since the PMOS transistor 802 is kept in conduction, the voltage at the node 804 is changed to the voltage $V_{DD}$.

Since the voltage at the node 804 reaches the voltage $V_{DD}$, the NMOS transistor 811 is brought into conduction and the PMOS transistor 810 is brought into non-conduction. Since the NMOS transistor 811 is kept in conduction, the voltage at the node 809 is changed to the voltage GND.

A slight time is required to perform processing in the inverter circuit C by the time the voltage at the node 809 changes from the "voltage $V_{DD}$" to the "voltage GND" after the voltage at the node 804 has been changed from the "voltage GND" to the "voltage $V_{DD}$". Thus, the NMOS transistor 808 is maintained in the conducting state. As a result, a time zone exists in which the PMOS transistor 802, NMOS transistor 808 and NMOS transistor 807 are kept in conduction. Thus, a current path is generated over a channel or path extending in order of the "voltage $V_{DD}$-→PMOS transistor 802-→NMOS transistor 808-→NMOS transistor 807-→voltage GND". Owing to such generation, the voltage at the node BN to which the voltage GND is applied, gradually rises. A rise in voltage of the node BN is terminated when the voltage at the node 809 is changed to the voltage GND and the NMOS transistor 808 is brought to the non-conducting state. Thereafter, the voltage GND is applied to the node BN through the NMOS transistor 807 kept in conduction at all times, whereby the voltage at the node BN gradually drops to the voltage GND.

As described above, when the voltage applied to the node 801 changes, the conventional driver circuit generates the two kinds of current paths according to the applied voltage.

A description will first be made of the meaning that the conventional driver circuit generates the current path in order of the "voltage $V_{DD}$-→PMOS transistor 805-→PMOS transistor 806-→NMOS transistor 803-→voltage GND". The conventional driver circuit generates the current path so as to reduce the voltage applied to the node BP. Owing to the reduction in the voltage applied to the node BP, the conventional driver circuit lowers the voltage applied to the substrate for the PMOS transistor 810. Owing to the reduction in the substrate voltage of the PMOS transistor 810, the conventional driver circuit reduces a threshold voltage of the PMOS transistor 810 and increases a driving force of the PMOS transistor 810. Thus, the conventional driver circuit can be operated at high speed even when the PMOS transistor 810 constituting the inverter circuit C is placed under the low source voltage.

A description will next be made of the meaning that the conventional driver circuit generates the current path in order of the voltage $V_{DD}$-→PMOS transistor 802-→NMOS transistor 808-→NMOS transistor 807-→voltage GND". The conventional driver circuit generates the current path to thereby increase the voltage applied to the node BN. Owing to the increase in the voltage applied to the node BN, the conventional driver circuit raises the voltage applied to the substrate for the NMOS transistor 811 connected to the node BN. With the increase in the substrate voltage of the NMOS transistor 811, the conventional driver circuit reduces a threshold voltage of the NMOS transistor 811 and raises a driving force of the NMOS transistor 811. Thus, the conventional driver circuit can be operated at high speed even when the NMOS transistor 811 constituting the inverter circuit C is placed under the low source voltage.

In the conventional driver circuit, however, a drop in the voltage applied to the node BP due to the current path generated over the path extending in order of the "voltage $V_{DD}$-→PMOS transistor 805-→PMOS transistor 806-→NMOS transistor 803-→voltage GND", is terminated when the voltage $V_{DD}$ is applied to the node 809 and the PMOS transistor 806 is brought into non-conduction. Thereafter, the voltage $V_{DD}$ is applied to the node BP through the PMOS transistor 805 kept in conduction at all times, so that the voltage applied to the node BP gradually rises to the voltage $V_{DD}$. Thus, the voltage applied to the node BP is kept in a low state as compared with the voltage $V_{DD}$ until it is returned to the voltage $V_{DD}$ through the PMOS transistor 805. Since the voltage applied to the node BP results in the voltage applied to the substrate for the PMOS transistor 810, the threshold voltage of the PMOS transistor 810 is brought to a low state even during the static period. Thus, when the threshold voltage is kept in the low state during the static period, a sub-threshold leakage current, which flows in a channel direction of the PMOS transistor 810, becomes great and hence power consumption cannot be reduced to a sufficient degree. Further, a rise in the voltage applied to the node BN due to the current path extending in order of the "voltage $V_{DD}$-→PMOS transistor 802-→NMOS transistor 808-→NMOS transistor 807-→voltage GND" is terminated when the voltage GND is applied to the node 809 and the NMOS transistor 808 is brought into non-conduction. Thereafter, the voltage GND is applied to the node BN through the NMOS transistor 807 kept in conduction at all times, so that the voltage applied to the node BN gradually drops. Thus, the voltage applied to the node BN is kept in a state higher than the voltage GND until it is returned to the voltage GND through the NMOS transistor 807. Here the voltage applied to the node BN is brought to the substrate voltage of the NMOS transistor 811, so that the threshold voltage of the NMOS transistor 811 is brought to a low state even during the static period. Thus, when the threshold voltage is kept in the low state during the static period, a sub-threshold leakage current, which flows in a channel direction of the NMOS transistor 811, becomes great, so that power consumption cannot be sufficiently reduced.

SUMMARY OF THE INVENTION

With the foregoing problems in view, it is therefore an object of the present invention to provide a driver circuit comprising a first inverter circuit for inverting an input voltage and supplying a first inverted voltage therefrom, a second inverter circuit which has a first conduction type transistor and a second conduction type transistor different from the first conduction type transistor and which inverts the first inverted voltage and supplies a second inverted voltage therefrom, a substrate voltage supply circuit for supplying voltages to a substrate for the first conduction type transistor and a substrate for the second conduction type transistor according to the second inverted voltage respectively, and a first substrate voltage control circuit for adjusting the voltage applied to the substrate for the first conduction type transistor according to the second inverted voltage.

It is another object of the present invention to provide a driver circuit comprising a first inverter circuit for inverting an input voltage and supplying a first inverted voltage therefrom, a second inverter circuit which has a first conduction type transistor and a second conduction type transistor different from the first conduction type transistor and which inverts the first inverted voltage and supplies a second inverted voltage therefrom, a substrate voltage supply circuit for supplying voltages to a substrate for the first conduction type transistor and a substrate for the second conduction type transistor according to the second inverted voltage respectively, and a second substrate voltage control circuit for adjusting the voltage applied to the substrate for the second conduction type transistor according to the second inverted voltage.

It is a further object of the present invention to provide a driver circuit comprising a first inverter circuit for inverting an input voltage and supplying a first inverted voltage therefrom, a second inverter circuit which includes a first conduction type transistor and a second conduction type transistor different from the first conduction type transistor and which inverts the first inverted voltage and supplies a second inverted voltage therefrom, a substrate voltage supply circuit for supplying voltages to a substrate for the first conduction type transistor and a substrate for the second conduction type transistor according to the second inverted voltage respectively, and a third substrate voltage control circuit for adjusting the voltages applied to the substrates for the first and second conduction type transistors according to the second inverted voltage.

Typical ones of various inventions of the present inventions have been shown in brief. However, the various inventions of the present application and specific configurations of these inventions will be understood from the following description.

BRIEF DESCRIPTION OF THE DRAWINGS

The objects and features of this invention will become more apparent from a consideration of the following detailed description and the accompanying drawings in which.

DESCRIPTION OF THE PREFERRED EMBODIMENTS

Preferred embodiments of the present invention will hereinafter described in detail with reference to the accompanying drawings.

First Embodiment

Figure 1:
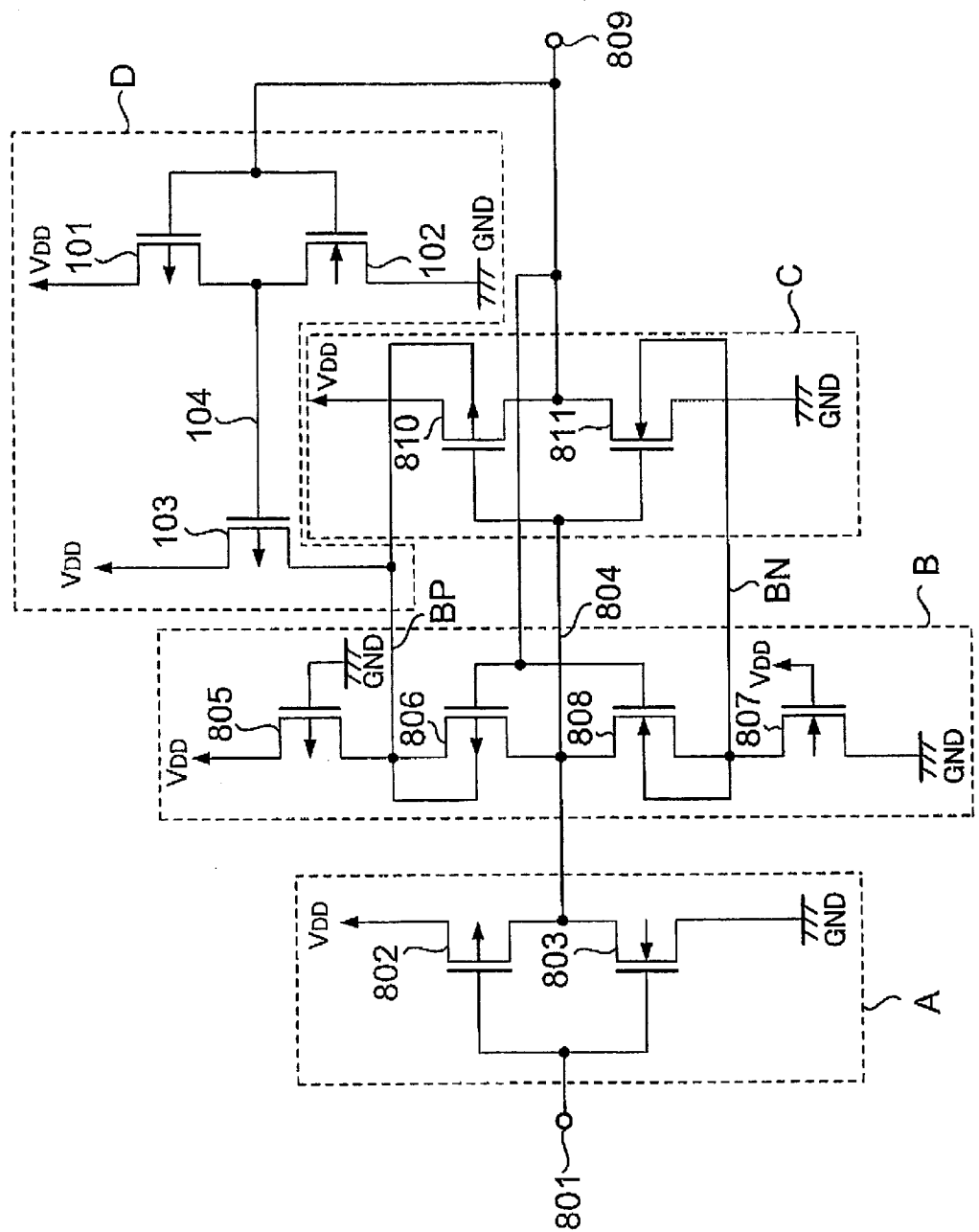
FIG. 1 is a circuit diagram showing a driver circuit according to a first embodiment of the present invention.

A first embodiment of the present invention will hereinafter be described with reference to FIG. 1. FIG. 1 is a circuit diagram showing a driver circuit according to the first embodiment of the present invention.

The configuration of the first embodiment will first be described.

Since an inverter circuit A, a substrate voltage supply circuit B and an inverter circuit C shown in the drawing are identical to those employed in the conventional driver circuit, the description thereof will therefore be omitted. A substrate voltage control circuit D, which constitutes a feature of the present invention, will hereinafter be described.

The substrate voltage control circuit D comprises an inverter circuit comprised of a PMOS transistor 101 and an NMOS transistor 102, and a PMOS transistor 103. In the substrate voltage control circuit D, the PMOS transistor and the NMOS transistors comprise control electrodes, first electrodes and second electrodes respectively.

The control electrode of the PMOS transistor 101 is electrically connected to a node 809. A voltage $V_{DD}$ (e.g., 1.0V) is applied to the first electrode of the PMOS transistor 101. The second electrode of the PMOS transistor 101 is electrically connected to a node 104. The control electrode of the NMOS transistor 102 is electrically connected to the node 809. A voltage GND (e.g., 0V) is applied to the first electrode of the NMOS transistor 102. The second electrode of the NMOS transistor 102 is electrically connected to the node 104. Further, the control electrode of the PMOS transistor 103 is electrically connected to the node 104, the first electrode thereof is supplied with the voltage $V_{DD}$ and the second electrode thereof is electrically connected to a node BP.

Figure 2A:
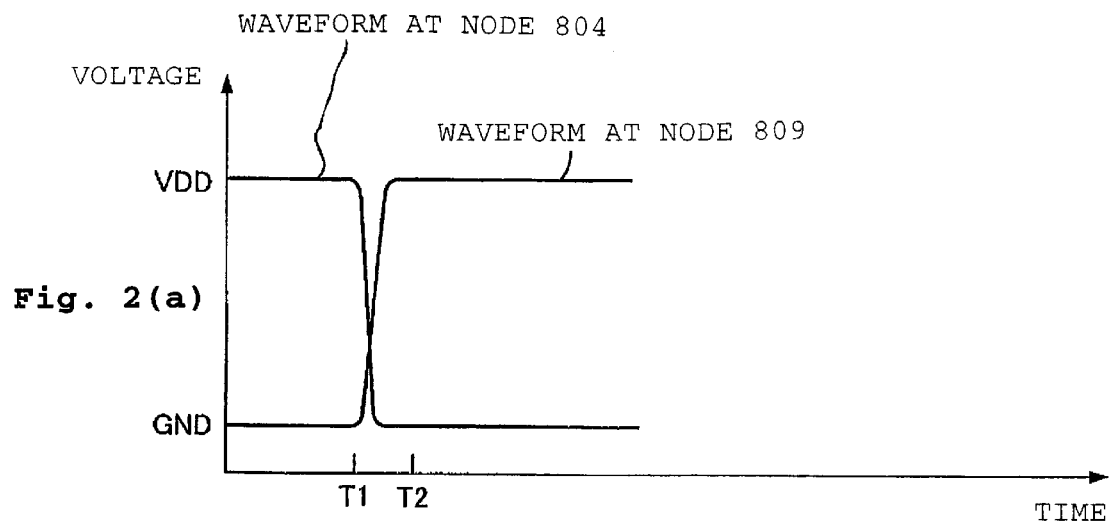
FIG. 2 is a timing chart showing changes in voltages applied to nodes 804, 809 and BP employed in each of the driver circuit according to the first embodiment and a conventional driver circuit.
Figure 2B:
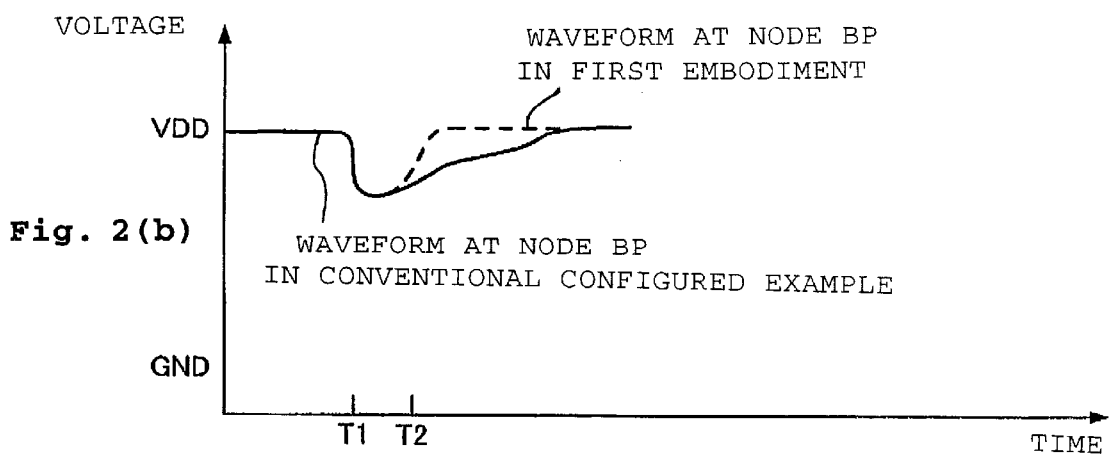
Figure 3:
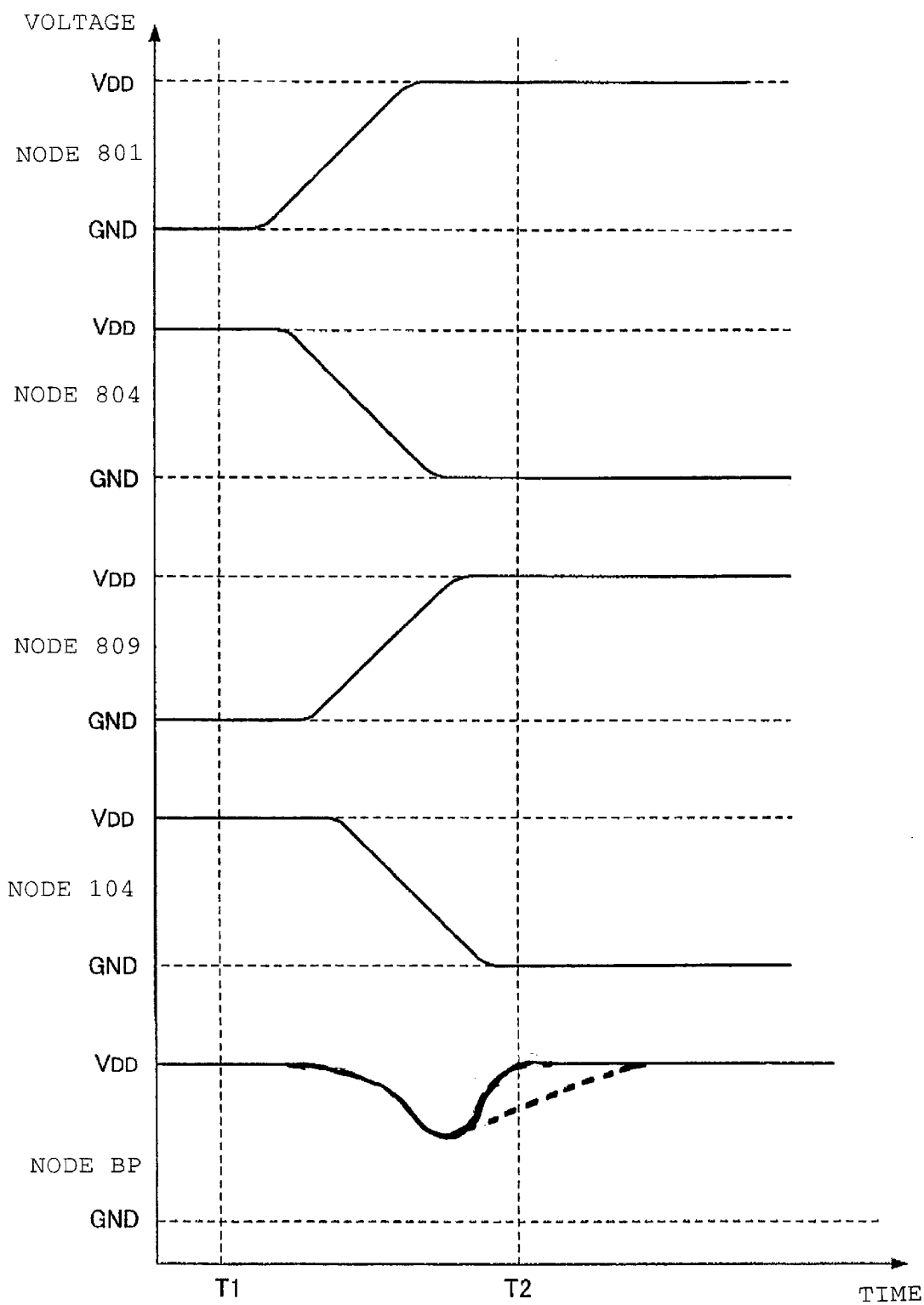
FIG. 3 is a timing chart illustrating the operation of respective nodes employed in the first embodiment.

The operation of the first embodiment will next be explained with reference to FIGS. 2 and 3. FIG. 2(*a*) is a timing chart showing a change in voltage applied to a node 804 and a change in voltage applied to the node 809. FIG. 2(*b*) is a timing chart showing changes in voltages applied to each individual nodes BP employed in the driver circuit according to the first embodiment and the conventional driver circuit. FIG. 3 is a timing chart showing changes in voltages applied to the respective nodes, which have been created to easily understood the present invention.

Assume that the voltage GND is applied to a node 801 at a time T1. In doing so, the node 804 is brought to the voltage $V_{DD}$ and the node 809 is brought to the voltage GND. Owing to the application of the voltage GND to the node 809, the PMOS transistor 101 is brought to a conducting state and the NMOS transistor 102 is brought to a non-conducting state. Thus, the node 104 reaches the voltage $V_{DD}$ since the PMOS transistor 101 is kept in conduction. The voltage $V_{DD}$ is applied to the node 104 so that the PMOS transistor 103 is brought into non-conduction. Thus, the node BP is not supplied with the voltage $V_{DD}$ through the PMOS transistor 103.

Next consider where the voltage $V_{DD}$ is applied to the node 801 between the time T1 and a time T2. In doing so, the voltage applied to the node 801 changes from the "voltage GND at the time T1" to the "voltage $V_{DD}$". Thus, a current path is developed over a path extending in order of the "voltage $V_{DD}$-→PMOS transistor 805-→PMOS transistor 806-→NMOS transistor 803-→voltage GND" as described above, so that the voltage at the node BP to which the voltage $V_{DD}$ has been applied, gradually drops. The drop in the voltage applied to the node BP is terminated when the voltage applied to the node 809 is changed to the voltage $V_{DD}$ and the PMOS transistor 806 is brought into non-conduction. Thereafter, the voltage $V_{DD}$ is applied to the node BP through the PMOS transistor 805 kept in conduction at all times, so that the voltage applied to the node BP gradually rises. This is the same as the conventional example.

Further, in the driver circuit according to the first embodiment, the voltage $V_{DD}$ is applied to the node 809 so that the PMOS transistor 101 is brought into non-conduction and the NMOS transistor 102 is brought into conduction. Since the NMOS transistor 102 is now kept in conduction, the node 104 reaches the voltage GND. Owing to the application of the voltage GND to the node 104, the PMOS transistor 103 is brought into conduction. As a result, the voltage $V_{DD}$ is applied to the node BP through the PMOS transistor 103.

The processing speed of the substrate voltage control circuit D may preferably be made faster in order to quickly apply the voltage $V_{DD}$ to the node BP so that the voltage at the node BP is set to the voltage $V_{DD}$.

According to the driver circuit of the first embodiment as a result of such a configuration as described above, the voltage $V_{DD}$ is applied to the node BP through the PMOS transistor 805 and the PMOS transistor 103. Thus, as compared with the conventional driver circuit wherein the voltage $V_{DD}$ is applied through the PMOS transistor 805 alone, the driver circuit according to the first embodiment is capable of quickly increasing the voltage at the node BP, corresponding to a voltage applied to a substrate for a PMOS transistor 810 to the voltage $V_{DD}$ because the voltage $V_{DD}$ is applied even through the PMOS transistor 103. Accordingly, as compared with the conventional driver circuit, the present driver circuit can reduce a sub-threshold leakage current, which flows in a channel direction of the PMOS transistor 810 during a static period, thereby making it possible to lessen power consumption.

Second Embodiment

Figure 4:
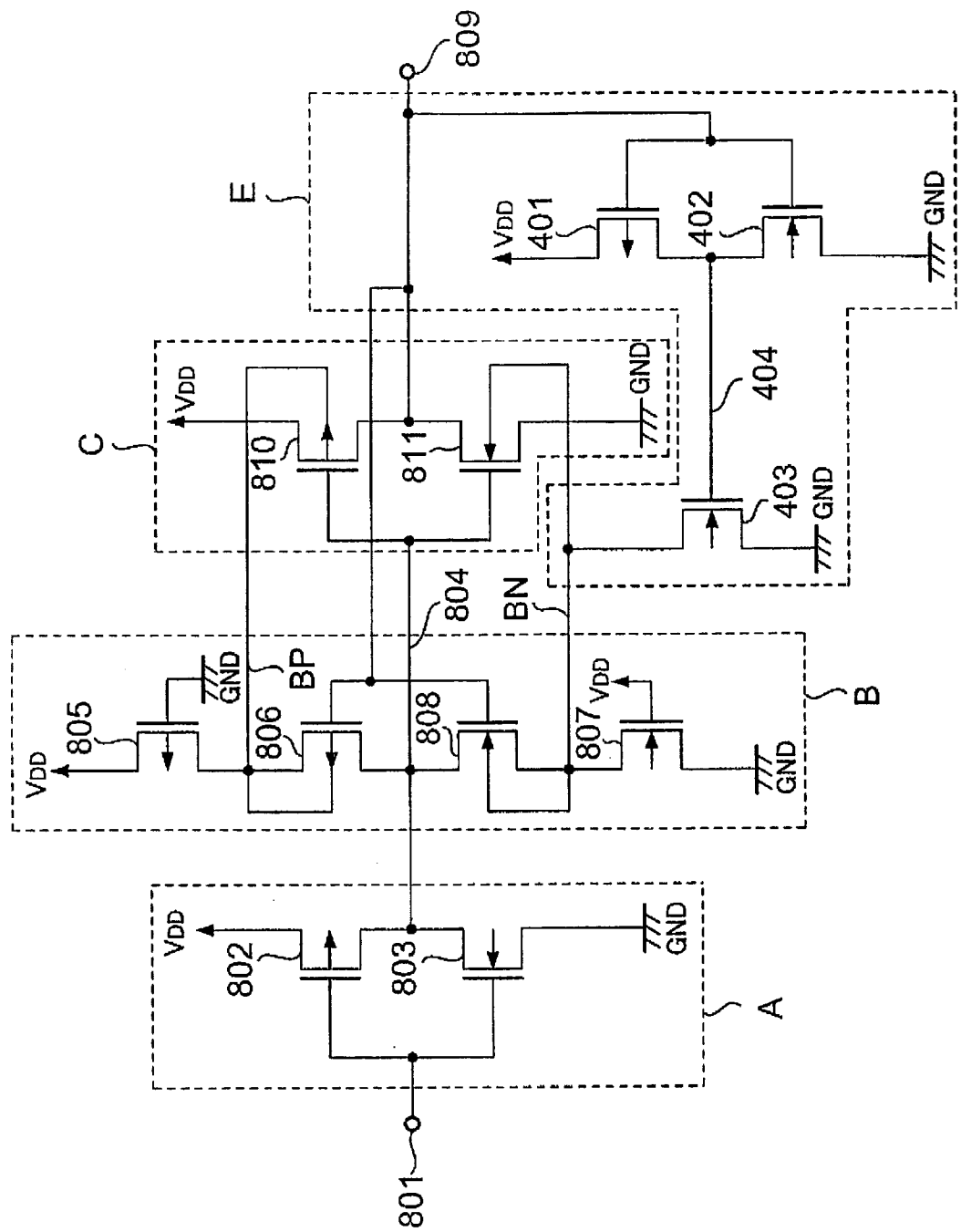
FIG. 4 is a circuit diagram showing a driver circuit according to a second embodiment of the present invention.

A second embodiment of the present invention will next be explained with reference to FIG. 4. FIG. 4 is a circuit diagram of a driver circuit according to the second embodiment of the present invention.

The configuration of the second embodiment will first be described.

Since an inverter circuit A, a substrate voltage supply circuit B and an inverter circuit C shown in the drawing are identical to those employed in the conventional driver circuit, the description thereof will therefore be omitted. A substrate voltage control circuit E, which constitutes a feature of the present invention, will hereinafter be described.

The substrate voltage control circuit E comprises an inverter circuit comprised of a PMOS transistor 401 and an NMOS transistor 402, and an NMOS transistor 403. In the substrate voltage control circuit E, the PMOS transistor and the NMOS transistors comprise control electrodes, first electrodes and second electrodes respectively.

The control electrode of the PMOS transistor 401 is electrically connected to a node 809. A voltage $V_{DD}$ (e.g., 1.0V) is applied to the first electrode of the PMOS transistor 401. The second electrode of the PMOS transistor 401 is electrically connected to a node 404. The control electrode of the NMOS transistor 402 is electrically connected to the node 809. A voltage GND (e.g., 0V) is applied to the first electrode of the NMOS transistor 402. The second electrode of the NMOS transistor 402 is electrically connected to the node 404. Further, the control electrode of the NMOS transistor 403 is electrically connected to the node 404, the first electrode thereof is supplied with the voltage GND and the second electrode thereof is electrically connected to a node BN.

Figure 5A:
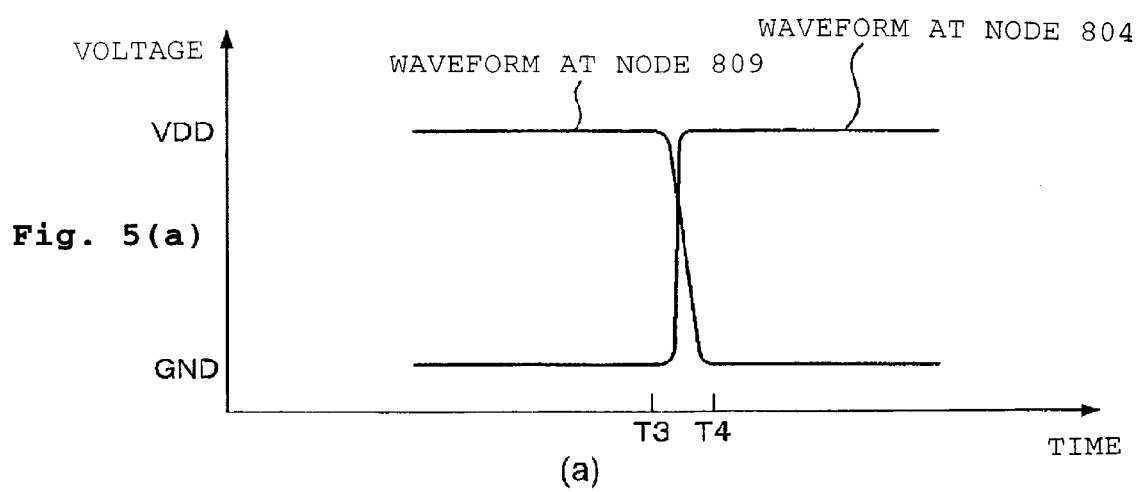
FIG. 5 is a timing chart illustrating changes in voltages applied to nodes 804, 809 and BN employed in the driver circuit according to the second embodiment and those employed in the conventional driver circuit.
Figure 5B:
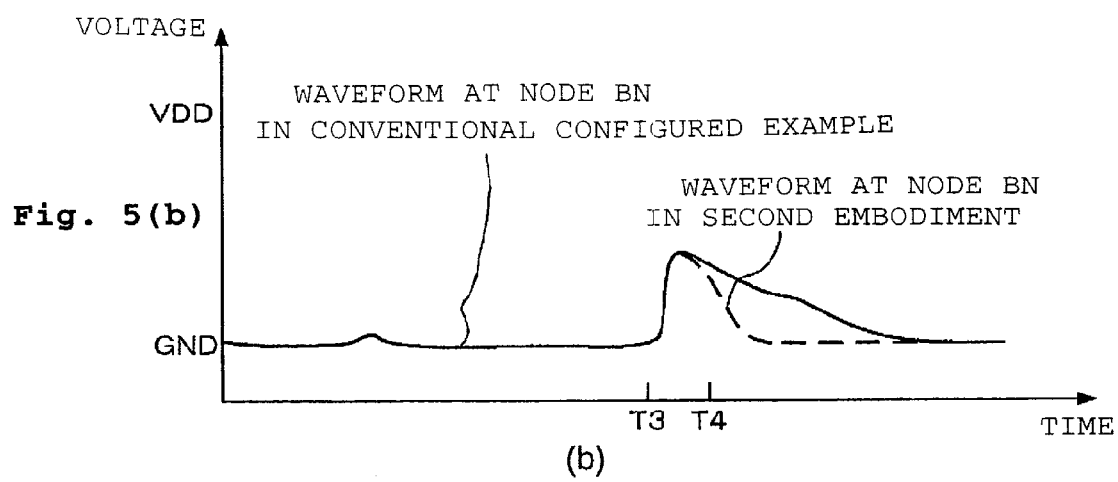

The operation of the second embodiment will next be explained with reference to FIG. 5. FIG. 5(*a*) is a timing chart showing a change in voltage applied to a node 804 and a change in voltage applied to the node 809. FIG. 5(b) is a timing chart showing changes in voltages applied to each individual nodes BN employed in the driver circuit according to the second embodiment and the conventional driver circuit.

Assume that the voltage $V_{DD}$ is applied to a node 801 at a time T3. In doing so, the node 804 is brought to the voltage GND and the node 809 is brought to the voltage $V_{DD}$. Owing to the application of the voltage $V_{DD}$ to the node 809, the PMOS transistor 401 is brought to a non-conducting state and the NMOS transistor 402 is brought to a conducting state. Thus, the node 404 reaches the voltage GND since the NMOS transistor 402 is kept in conduction. The voltage GND is applied to the node 404 so that the NMOS transistor 403 is brought into non-conduction. Thus, the node BN is not supplied with the voltage GND through the NMOS transistor 403.

Next consider where the voltage GND is applied to the node 801 between the time T3 and a time T4. In doing so, the voltage applied to the node 801 changes from the "voltage $V_{DD}$ at the time T3" to the "voltage GND". Thus, a current path is developed over a channel or path extending in order of the "voltage $V_{DD}$-→PMOS transistor 802-→NMOS transistor 808-→NMOS transistor 807-→voltage GND" as described above, so that the voltage at the node BN to which the voltage GND has been applied, gradually rises. The rise in the voltage applied to the node BN is completed when the voltage applied to the node 809 is changed to the voltage GND and the NMOS transistor 808 is brought into non-conduction. Thereafter, the voltage GND is applied to the node BN through the NMOS transistor 807 kept in conduction at all times, so that the voltage applied to the node BN gradually drops. This is the same as the conventional example.

Further, in the driver circuit according to the second embodiment, the voltage GND is applied to the node 809 so that the PMOS transistor 401 is brought into conduction and the NMOS transistor 402 is brought into non-conduction. Since the PMOS transistor 401 is now kept in conduction, the node 404 reaches the voltage $V_{DD}$. Owing to the application of the voltage $V_{DD}$ to the node 404, the NMOS transistor 403 is brought into conduction. As a result, the voltage GND is applied to the node BN through the NMOS transistor 403.

The processing speed of the substrate voltage control circuit E may preferably be made faster in order to quickly apply the voltage GND to the node BN so that the voltage at the node BN is set to the voltage GND.

According to the driver circuit of the second embodiment as a result of such a configuration as described above, the voltage GND is applied to the node BN through the NMOS transistor 807 and the NMOS transistor 403. Thus, as compared with the conventional driver circuit wherein the voltage GND is applied through the NMOS transistor 807 alone, the driver circuit according to the second embodiment is capable of quickly dropping the voltage at the node BN, corresponding to a voltage applied to a substrate for an NMOS transistor 811 to the voltage GND because the voltage GND is applied even through the NMOS transistor 403. Accordingly, as compared with the conventional driver circuit, the present driver circuit is capable of reducing a sub-threshold leakage current, which flows in a channel direction of the NMOS transistor 811 during a static period, thereby making it possible to cut down power consumption.

Third Embodiment

Figure 6:
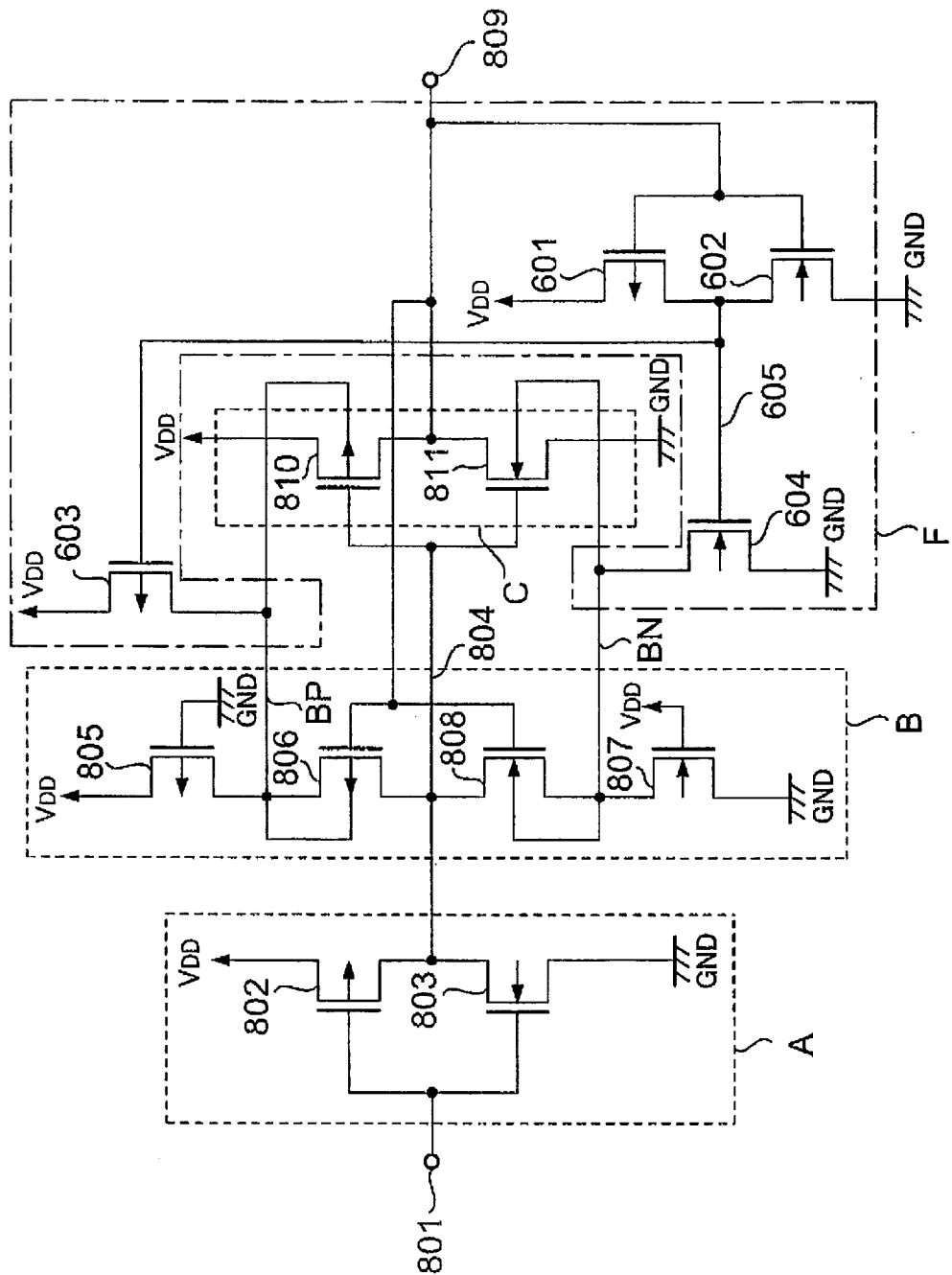
FIG. 6 is a circuit diagram showing a driver circuit according to a third embodiment of the present invention.

A third embodiment of the present invention will be explained below with reference to FIG. 6. FIG. 6 is a circuit diagram of a driver circuit according to the third embodiment of the present invention.

The configuration of the third embodiment will first be described.

Since an inverter circuit A, a substrate voltage supply circuit B and an inverter circuit C shown in the drawing are identical to those employed in the conventional driver circuit, the description thereof will therefore be omitted. A substrate voltage control circuit F, which constitutes a feature of the present invention, will hereinafter be described.

The substrate voltage control circuit F comprises an inverter circuit comprised of a PMOS transistor 601 and an NMOS transistor 602, a PMOS transistor 603 and an NMOS transistor 604. In the substrate voltage control circuit F, the PMOS transistor and the NMOS transistors comprise control electrodes, first electrodes and second electrodes respectively.

The control electrode of the PMOS transistor 601 is electrically connected to a node 809. A voltage $V_{DD}$ (e.g., 1.0V) is applied to the first electrode of the PMOS transistor 601. The second electrode of the PMOS transistor 601 is electrically connected to a node 605. The control electrode of the NMOS transistor 602 is electrically connected to the node 809. A voltage GND (e.g., 0V) is applied to the first electrode of the NMOS transistor 602. The second electrode of the NMOS transistor 602 is electrically connected to the node 605. Further, the control electrode of the PMOS transistor 603 is electrically connected to the node 605, the first electrode thereof is supplied with the voltage $V_{DD}$ and the second electrode thereof is electrically connected to a node BP. The control electrode of the NMOS transistor 604 is electrically connected to the node 605, the first electrode thereof is supplied with the voltage GND and the second electrode thereof is electrically connected to a node BN.

Figure 7A:
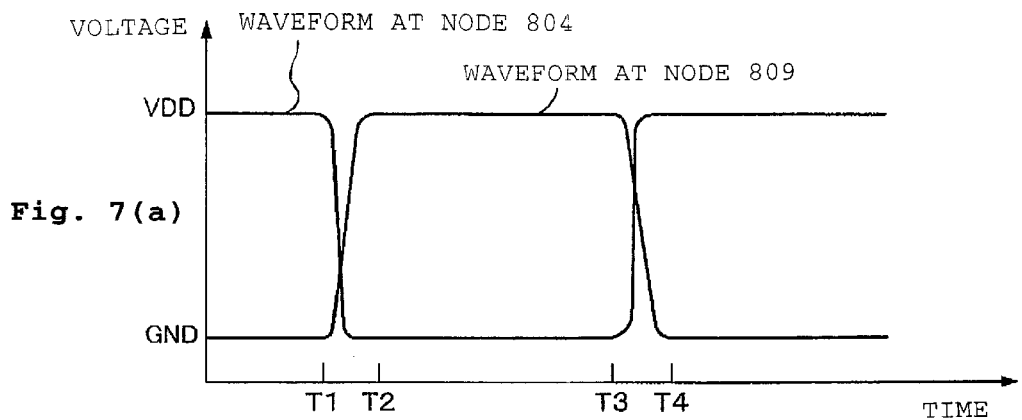
FIG. 7 is a timing chart illustrating changes in voltages applied to nodes 804, 809, BP and BN employed in the driver circuit according to the third embodiment and those employed in the conventional driver circuit.
Figure 7B:
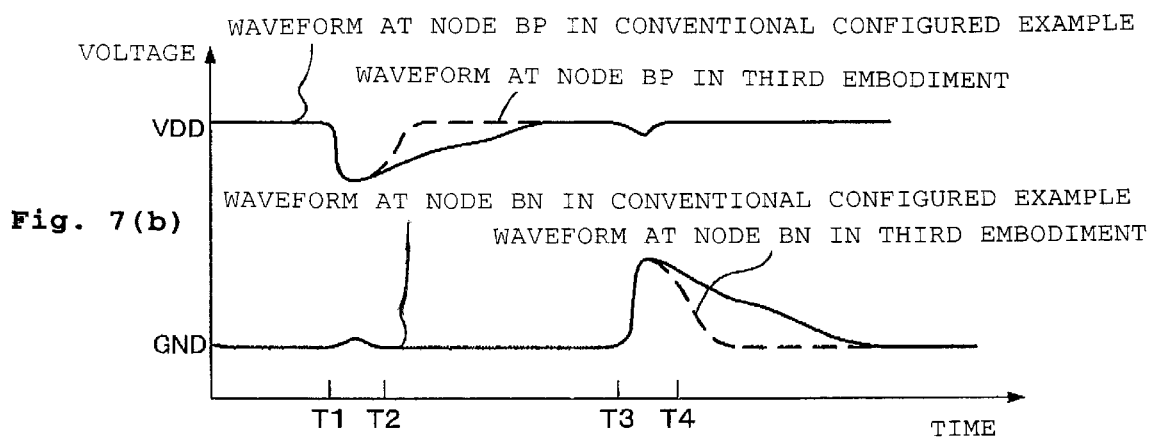
Figure 8:
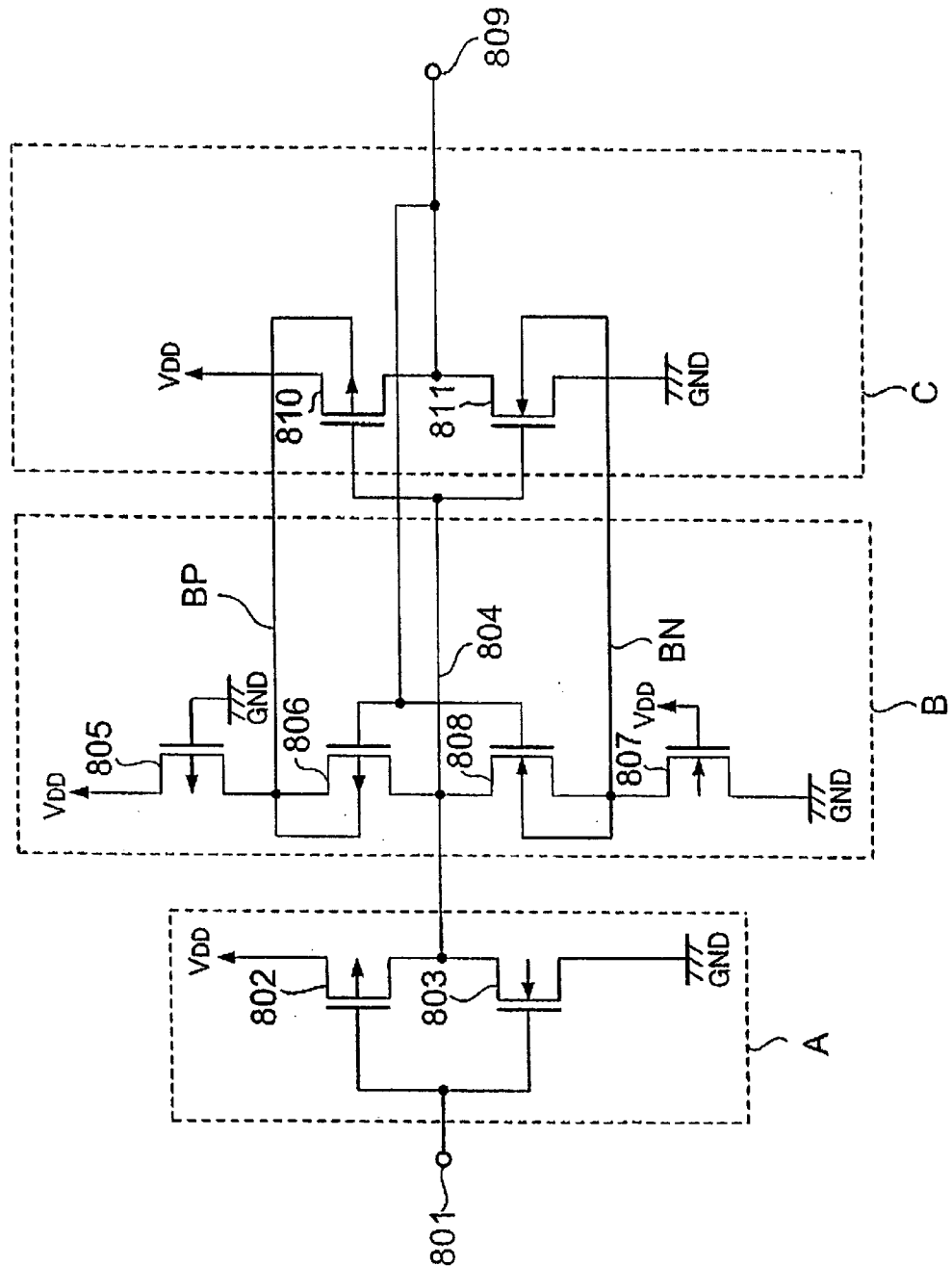
FIG. 8 is a circuit diagram showing the conventional driver circuit.
Figure 9A:
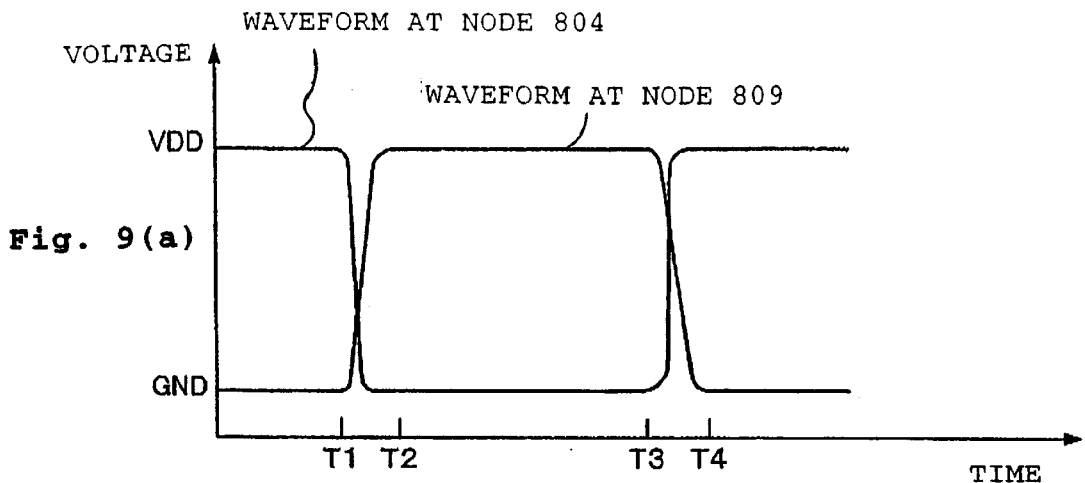
FIG. 9 is a timing chart showing changes in voltages applied to the nodes 804, 809, BP and BN employed in the conventional driver circuit.
Figure 9B:
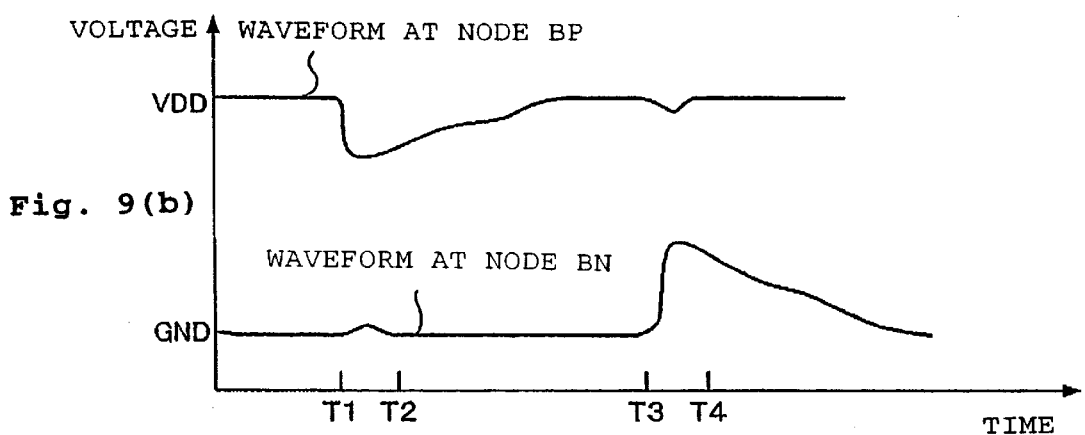

The operation of the third embodiment will next be explained with reference to FIG. 7. FIG. 7(a) is a timing chart showing a change in voltage applied to a node 804 and a change in voltage applied to the node 809. FIG. 7(b) is a timing chart showing changes in voltages applied to each individual nodes BP and BN employed in the driver circuit according to the third embodiment and the conventional driver circuit.

Assume that the voltage GND is applied to a node 801 at a time T1. In doing so, the node 804 is brought to the voltage $V_{DD}$ and the node 809 is brought to the voltage GND. Owing to the application of the voltage GND to the node 809, the PMOS transistor 601 is brought to a conducting state and the NMOS transistor 602 is brought to a non-conducting state. Thus, the node 605 reaches the voltage GND since the PMOS transistor 601 is kept in conduction. The voltage $V_{DD}$ is applied to the node 605 so that the PMOS transistor 603 is brought into non-conduction and the NMOS transistor 604 is brought into conduction. Thus, since the PMOS transistor 603 is kept in non-conduction, the node BP is not supplied with the voltage $V_{DD}$ through the PMOS transistor 603 and the voltage $V_{DD}$ is applied thereto through a PMOS transistor 805 alone. On the other hand, since the NMOS transistor 604 is kept in conduction, the voltage GND is applied to the node BN through the NMOS transistor 604 and applied thereto even through an NMOS transistor 807.

Assume that the voltage $V_{DD}$ is next applied to the node 801 between the time T1 and a time T2. In doing so, the voltage applied to the node 801 changes from the "voltage GND at the time Ti" to the "voltage $V_{DD}$". Thus, a current path is developed over a channel or path extending in order of the "voltage $V_{DD}$-→PMOS transistor 805-→PMOS transistor 806-→NMOS transistor 803-→voltage GND" as described above, so that the voltage at the node BP to which the voltage $V_{DD}$ has been applied, gradually drops. The drop in the voltage applied to the node BP is completed when the voltage applied to the node 809 is changed to the voltage $V_{DD}$ and the PMOS transistor 806 is brought into non-conduction. Thereafter, the voltage $V_{DD}$ is applied to the node BP through the PMOS transistor 805 kept in conduction at all times, so that the voltage applied to the node BP gradually rises. This is the same as the conventional example.

Further, in the driver circuit according to the third embodiment, the voltage $V_{DD}$ is applied to the node 809 so that the PMOS transistor 601 is brought into non-conduction and the NMOS transistor 602 is brought into conduction. Since the NMOS transistor 602 is now kept in conduction, the node 605 reaches the voltage GND. Owing to the application of the voltage GND to the node 605, the PMOS transistor 603 is brought into conduction and the NMOS transistor 604 is brought into non-conduction. Since the PMOS transistor 603 is kept in conduction, the voltage $V_{DD}$ is applied to the node BP through the PMOS transistor 603 and the voltage $V_{DD}$ is applied thereto even through the PMOS transistor 805. The processing speed of the substrate voltage control circuit F may preferably be made faster in order to quickly apply the voltage $V_{DD}$ to the node BP so that the voltage at the node BP is set to the voltage $V_{DD}$. On the other hand, since the NMOS transistor 604 is kept in non-conduction, the voltage GND is not applied to the node BN through the NMOS transistor 604 and the voltage GND is applied thereto through the NMOS transistor 807 alone.

Assume that the voltage GND is next applied to the node 801 between times T3 and T4. In doing so, the voltage applied to the node 801 changes from the "voltage $V_{DD}$ at the time T3" to the "voltage GND". Thus, a current path is developed over a channel or path extending in order of the "voltage $V_{DD}$-→PMOS transistor 802-→NMOS transistor 808-→NMOS transistor 807-→voltage GND" as described above, so that the voltage at the node BN to which the voltage GND has been applied, gradually rises. The rise in the voltage applied to the node BN is completed when the voltage applied to the node 809 is changed to the voltage GND and the NMOS transistor 808 is brought into non-conduction. Thereafter, the voltage GND is applied to the node BN through the NMOS transistor 807 kept in conduction at all times, so that the voltage applied to the node BN gradually drops. This is the same as the conventional example.

Further, in the driver circuit according to the third embodiment, the voltage GND is applied to the node 809 so that the PMOS transistor 601 is brought into conduction and the NMOS transistor 602 is brought into non-conduction. Since the PMOS transistor 601 is now kept in conduction, the node 605 reaches the voltage $V_{DD}$. Owing to the application of the voltage $V_{DD}$ to the node 605, the PMOS transistor 603 is brought into non-conduction and the NMOS transistor 604 is brought into conduction. Since the NMOS transistor 604 is kept in conduction, the voltage GND is applied to the node BN through the NMOS transistor 604 and the voltage GND is applied thereto even through the NMOS transistor 807. The processing speed of the substrate voltage control circuit F may preferably be made faster in order to quickly apply the voltage GND to the node BN so that the voltage at the node BN is rapidly set to the voltage GND. On the other hand, since the PMOS transistor 603 is kept in non-conduction, the voltage $V_{DD}$ is not applied to the node BP through the PMOS transistor 603 and the voltage $V_{DD}$ is applied thereto through the PMOS transistor 805 alone.

According to the driver circuit of the third embodiment as a result of such a configuration as described above, the voltage $V_{DD}$ is applied to the node BP through the PMOS transistor 805 and the PMOS transistor 603. Thus, as compared with the conventional driver circuit wherein the voltage $V_{DD}$ is applied through the PMOS transistor 805 alone, the driver circuit according to the third embodiment is capable of quickly rising the voltage at the node BP, corresponding to a voltage applied to a substrate for an NMOS transistor 810 to the voltage $V_{DD}$ because the voltage $V_{DD}$ is applied even through the PMOS transistor 603. Accordingly, as compared with the conventional driver circuit, the present driver circuit can reduce a sub-threshold leakage current, which flows in a channel direction of the NMOS transistor 810 during a static period, thereby making it possible to cut down power consumption.

Further, according to the invention showing the third embodiment, the voltage GND is applied to the node BN through the NMOS transistor 807 and the NMOS transistor 604. Thus, as compared with the conventional driver circuit wherein the voltage GND is applied through the NMOS transistor 807 alone, the driver circuit according to the third embodiment is capable of quickly dropping the voltage at the node BN, corresponding to a voltage applied to a substrate for an NMOS transistor 811 to the voltage GND because the voltage GND is applied even through the NMOS transistor 604. Accordingly, as compared with the conventional driver circuit, the present driver circuit can reduce a sub-threshold leakage current, which flows in a channel direction of the NMOS transistor 811 during a static period, thereby making it possible to cut down power consumption.

Furthermore, according to the invention showing the third embodiment, the provision of one substrate voltage control circuit F allows adjustments to the voltages applied to both the nodes BP and BN. Sharing the inverter circuit of the substrate voltage control circuit F between the nodes BP and BN makes it possible to achieve a space-saving configuration as compared with the case in which the respective substrate voltage control circuits employed in the first and second embodiments are respectively provided.

According to the driver circuit of the present invention as described above, since a substrate voltage control circuit for adapting to a change in substrate voltage of a MOS integrated circuit is provided, the present driver circuit is capable of reducing a sub-threshold leakage current flowing in a channel direction of a transistor during a static period, thereby making it possible to cut down power consumption.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A driver circuit comprising:
   a first inverter circuit for inverting an input voltage and supplying a first inverted voltage therefrom;
   a second inverter circuit having a first conduction type transistor and a second conduction type transistor different from said first conduction type transistor and for inverting the first inverted voltage and supplying a second inverted voltage therefrom;

a substrate voltage supply circuit for supplying voltages to a substrate for said first conduction type transistor and a substrate for said second conduction type transistor according to the second inverted voltage respectively; and a substrate voltage control circuit for adjusting the voltage applied to the substrate for said first conduction type transistor according to the second inverted voltage.

2. A driver circuit according to claim 1, wherein the first conduction type transistor is a PMOS transistor and the second conduction type transistor is an NMOS transistor.

3. A driver circuit comprising:

a first inverter circuit for inverting an input voltage and supplying a first inverted voltage therefrom;

a second inverter circuit having a first conduction type transistor and a second conduction type transistor and for inverting the first inverted voltage and supplying a second inverted voltage therefrom;

a substrate voltage supply circuit for supplying voltages to a substrate for said first conduction type transistor and a substrate for said second conduction type transistor according to the second inverted voltage respectively; and a substrate voltage control circuit for adjusting the voltages applied to the substrates for said first and second conduction type transistors according to the second inverted voltage.

4. A driver circuit comprising:

a first inverter circuit for inverting an input voltage and supplying a first inverted voltage therefrom;

a second inverter circuit having a first conduction type transistor and a second conduction type transistor different from said first conduction type transistor and for inverting the first inverted voltage and supplying a second inverted voltage therefrom;

a substrate voltage supply circuit for supplying voltages to a substrate for said first conduction type transistor and a substrate for said second conduction type transistor according to the second inverted voltage respectively; and a substrate voltage control circuit for adjusting the voltage applied to the substrate for said second conduction type transistor according to the second inverted voltage.

5. A driver circuit according to claim 4, wherein the first conduction type transistor is a PMOS transistor and the second conduction type transistor is an NMOS transistor.

6. A driver circuit comprising:

an inverter circuit comprised of a first conduction type transistor formed over a substrate and having a first threshold voltage when a first voltage is applied to the substrate and a second threshold voltage higher than the first threshold voltage when a second voltage higher than the first voltage is applied to the substrate, and a second conduction type transistor different from said first conduction type transistor;

a substrate voltage supply circuit for supplying the first voltage to the substrate when said first conduction type transistor changes from a non-conducting state to a conducting state; and a substrate voltage control circuit for supplying the second voltage to the substrate after said first conduction type transistor is changed to the conducting state.

7. A driver circuit according to claim 6, wherein the first conduction type transistor is a PMOS transistor and the second conduction type transistor is an NMOS transistor.

8. A driver circuit comprising:

an inverter circuit comprised of a first conduction type transistor and a second conduction type transistor formed over a substrate and different from said first conduction type transistor, said second conduction type transistor having a first threshold voltage when a first voltage is applied to the substrate and a second threshold voltage lower than the first threshold voltage when a second voltage lower than the first voltage is applied to the substrate;

a substrate voltage supply circuit for supplying the first voltage to the substrate when said second conduction type transistor changes from a non-conducting state to a conducting state; and a substrate voltage control circuit for supplying the second voltage to the substrate after said second conduction type transistor is changed to the conducting state.

9. A driver circuit according to claim 8, wherein the first conduction type transistor is a PMOS transistor and the second conduction type transistor is an NMOS transistor.

10. A driver circuit comprising:

an inverter circuit comprised of a first conduction type transistor formed over a substrate and having a first threshold voltage when a first voltage is applied to the substrate and a second threshold voltage higher than the first threshold voltage when a second voltage higher than the first voltage is applied to the substrate, and a second conduction type transistor different from said first conduction type transistor formed over the substrate, said second conduction type transistor having a third threshold voltage when a third voltage is applied to the substrate and a fourth threshold voltage lower than the third threshold voltage when a fourth voltage lower than the third voltage is applied to the substrate;

a substrate voltage supply circuit for supplying the first voltage to the substrate when said first conduction type transistor changes from a non-conducting state to a conducting state and supplying the third voltage to the substrate when said second conduction type transistor changes from the non-conducting state to the conducting state; and a substrate voltage control circuit for supplying the second voltage to the substrate after said first conduction type transistor is changed to the conducting state and supplying the fourth voltage to the substrate after said second conduction type transistor is changed to the conducting state.

* * * * *